United States Patent [19]

Cassarino, Jr. et al.

[11] 4,042,832
[45] Aug. 16, 1977

[54] LOGIC BOARD INTERLOCK INDICATION APPARATUS

[75] Inventors: Frank V. Cassarino, Jr., Weston; George J. Barlow, Tewksbury, both of Mass.

[73] Assignee: Honeywell Information Systems Inc., Waltham, Mass.

[21] Appl. No.: 644,653

[22] Filed: Dec. 29, 1975

[51] Int. Cl.² ............................................. H02J 13/00
[52] U.S. Cl. .................................... 307/149; 324/51; 361/189; 340/256
[58] Field of Search ............... 340/256, 248 R, 248, 340/256, 280, 282; 324/51; 307/149, 130; 317/119, 101; 339/19, 76, 17 LM, 75 M, 65, 66 M, 113 R, 113 B, 113 L; 361/189

[56] References Cited

U.S. PATENT DOCUMENTS

| 3,191,095 | 6/1965 | Hefti | 317/101 DH |
| 3,691,399 | 9/1972 | Vinch et al. | 317/101 DH |

Primary Examiner—Robert K. Schaefer
Assistant Examiner—Morris Ginsburg
Attorney, Agent, or Firm—John S. Solakian; Ronald T. Reiling

[57] ABSTRACT

A plurality of logic boards coupled together over a common electrical bus by use of a plurality of connectors, at least one per board, which includes at least one pair of terminals for coupling an interlock signal wire which is daisy chained through each of such boards and connectors. By providing a known signal state on the interlock signal wire at one end of the bus, an improper connection or an error condition in one of the logic boards will be indicated by a sensor, which may be included at the last logic board, if the known signal state is not received at the sensor.

16 Claims, 3 Drawing Figures

LOGIC BOARD INTERLOCK INDICATION APPARATUS

BACKGROUND OF THE INVENTION

The present invention generally relates to data processing system connection techniques and more particularly to apparatus for verifying the integrity of such connections.

A data processing system is typically made up of a plurality of elements. These elements typically include a plurality of logic boards, each of which provides a major function. For example, one or more logic boards may comprise the system's central processing unit and other logic boards may include memory, peripheral device controllers and communication controllers as needed in a particular system. These logic boards are interconnected by use of well known connectors. It has often been said that such connections or the lack thereof produce more system problems than the circuit components which may be found on the logic boards. Thus, it is imperative that the proper interconnections of such boards be verified without the need of physical inspection of each connector. It is also important to verify that each of such logic boards is in proper operating condition.

It is accordingly a primary object of the present invention to provide apparatus for indicating the integrity of system connections and logic elements in a data processing system.

SUMMARY OF THE INVENTION

The objects of the present invention are achieved by providing logic board interlock indication apparatus comprising a first plurality of logic boards, with at least one electrical connector included on each of such boards wherein each such connector includes a plurality of terminals. Apparatus is provided for electrically coupling each of the connectors included in which apparatus is apparatus for connecting an electrical circuit through each of the logic boards in a daisy chained or serial arrangement so that a continuous electrical circuit is established from a first one of the boards to a last one of the boards. Apparatus is provided for coupling a first signal state to one of the terminals of one of the connectors included on the first one of the boards and further provided is apparatus for indicating that such first signal state has been received at one of such connectors included on the last one of such logic boards whereby the proper connection of such boards with such connectors is indicated.

BRIEF DESCRIPTION OF THE DRAWINGS

The above and other objects of the present invention are achieved in the illustrative embodiment as described with respect to the figures in which.

DETAILED DESCRIPTION OF THE PREFERRED EMBODIMENTS

Figure 1:
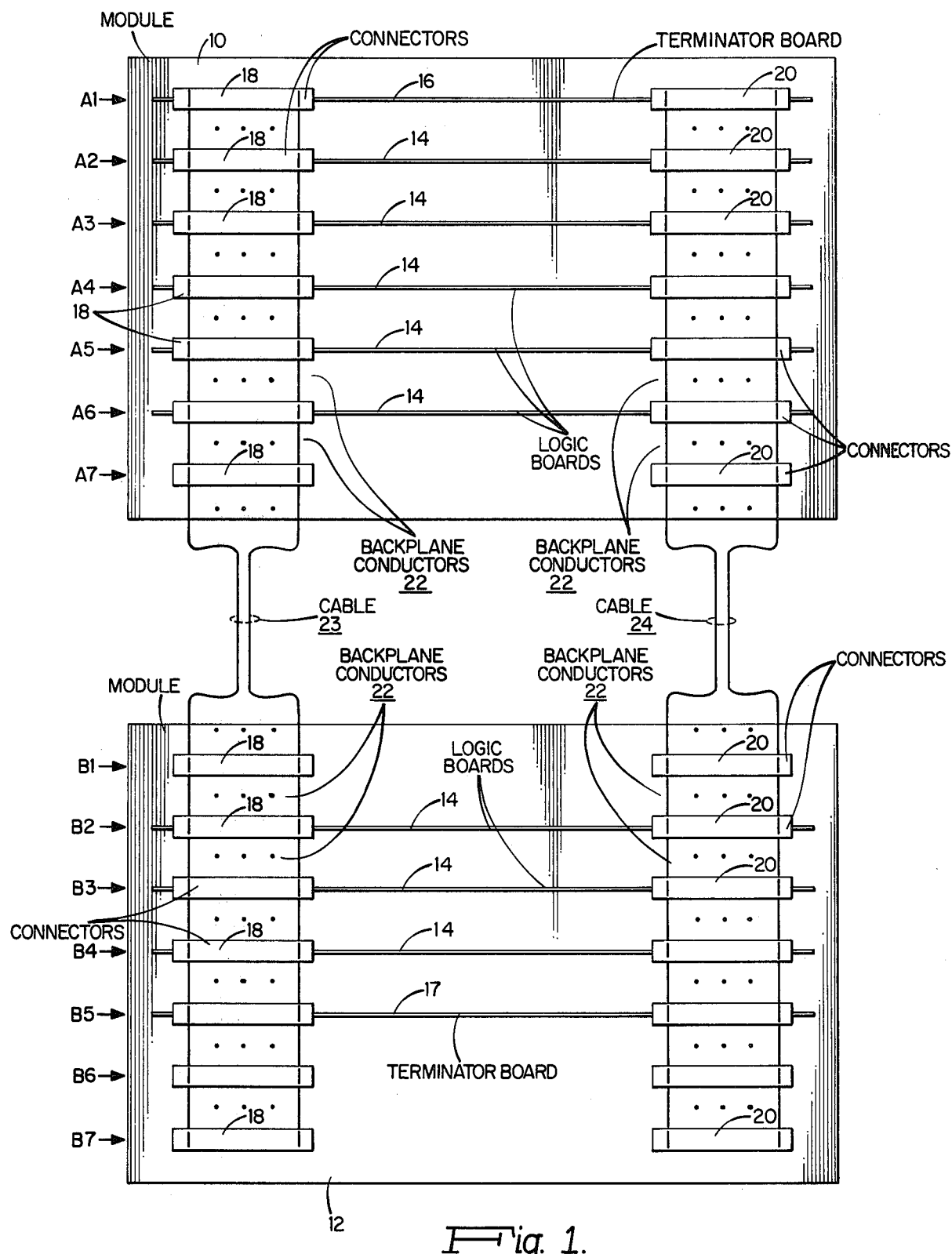
FIG. 1 illustrates a typical overall system environment of the present invention.

Now referring to FIG. 1, the environment of the present invention shall be explained. The apparatus of the present invention may be included in a module 10 or in addition another module 12 or in fact further such modules. Each such module may include a plurality of logic boards 14, each having electronic components for providing a data processing function and each such logic board being identified by the row number in which it is included, i.e. rows A2 through A6 and rows B2 through B4 of modules 10 and 12 respectively. Each of such modules, in a two module system, includes at least one terminator board 16 or 17 and in a situation where the apparatus only includes one module, then two terminator boards 16 and 17 as shall be hereinafter explained. Connecting each of the logic boards and terminator boards together is a first plurality of connectors 18 shown on the left hand side of FIG. 1. Should the connectors 18 not include a sufficient number of terminals for the interconnection of the logic boards, then a second plurality of connectors 20 may be provided as shown on the right hand side of FIG. 1. Thus in a system in which a plurality of signals must be transmitted in parallel to each of the logic boards such as for example that provided over a common electrical bus, then unless a suitable connector having many terminals is available, then two or more connectors must be provided for each such logic board.

In a system having more than one module as shown in FIG. 1, such connectors on the logic boards may be interconnected via a cable 23, and in the case of two pluralities of connectors, an additional cable 24. Cables 23 and 24 are not required if only one such module makes up the system. The terminator board 16 is provided in order to provide for example signal amplifiers or devices for signals received from another source, ground connections, terminating resistors and the like. As discussed hereinafter, the ground connections provided for use in indicating the integrity of the connections of such logic boards and further ground connections, for example as utilized in establishing the priority of the functions provided by such logic boards, as indicated in the priority network of U.S. Pat. No. 3,832,692. Terminator board 17, which in the case of a single module would have been included for example in module 10 in slot A7 assuming five logic boards, or as illustrated in FIG. 1 will be included in the slot following the last logic board, may include terminating resistors, cross connections between the connectors 18 and 20 as for example may be provided by the interlock indication apparatus of the present invention.

Still referring to FIG. 1 and in more detail, each of the logic boards which plugs into connectors 18 and 20 includes logic elements for providing the operation of certain functions. The common signals are provided by means of an interconnection with the connectors and a so-called backplane which includes a plurality of conductors 22 which may be simply printed circuit connections between the connectors, such connections being equal in number to the number of terminals on the connectors for that situation in which all of the electrical bus signals are common to each such logic board. For the interlock indication apparatus of the present invention, two terminals are used on each connector. Thus, what may be termed the data integrity signal is received at one terminal of the connector. This signal may be directly connected on the logic board for connection to the other terminal on the same connector which in turn is then connected to the next connector by means of one of the backplane conductors 22. On the other hand, the connection between the two terminals on one connector may be interrupted by what may be termed a basic or quality logic test circuit which indicates whether or not the logic board is functioning correctly. This signal may be provided for example in response to a test on the parity of the information included in the logic boards. This will be more particularly seen with respect to FIGS. 2 and 3.

It will thus be seen that the integrity connection line is coupled through each of the connectors 18 by means of at least two terminals in each such connector and by means of one of the backplane conductors 22 and in one embodiment may be coupled back through each of the connectors 20 by means of a connection through terminator board 17 and the backplane and terminals respectively so as to terminate on terminator board 16, i.e., the integrity line should preferably start and stop on terminator board 16 in the situation where there are at least two connectors per logic board.

Figure 2:
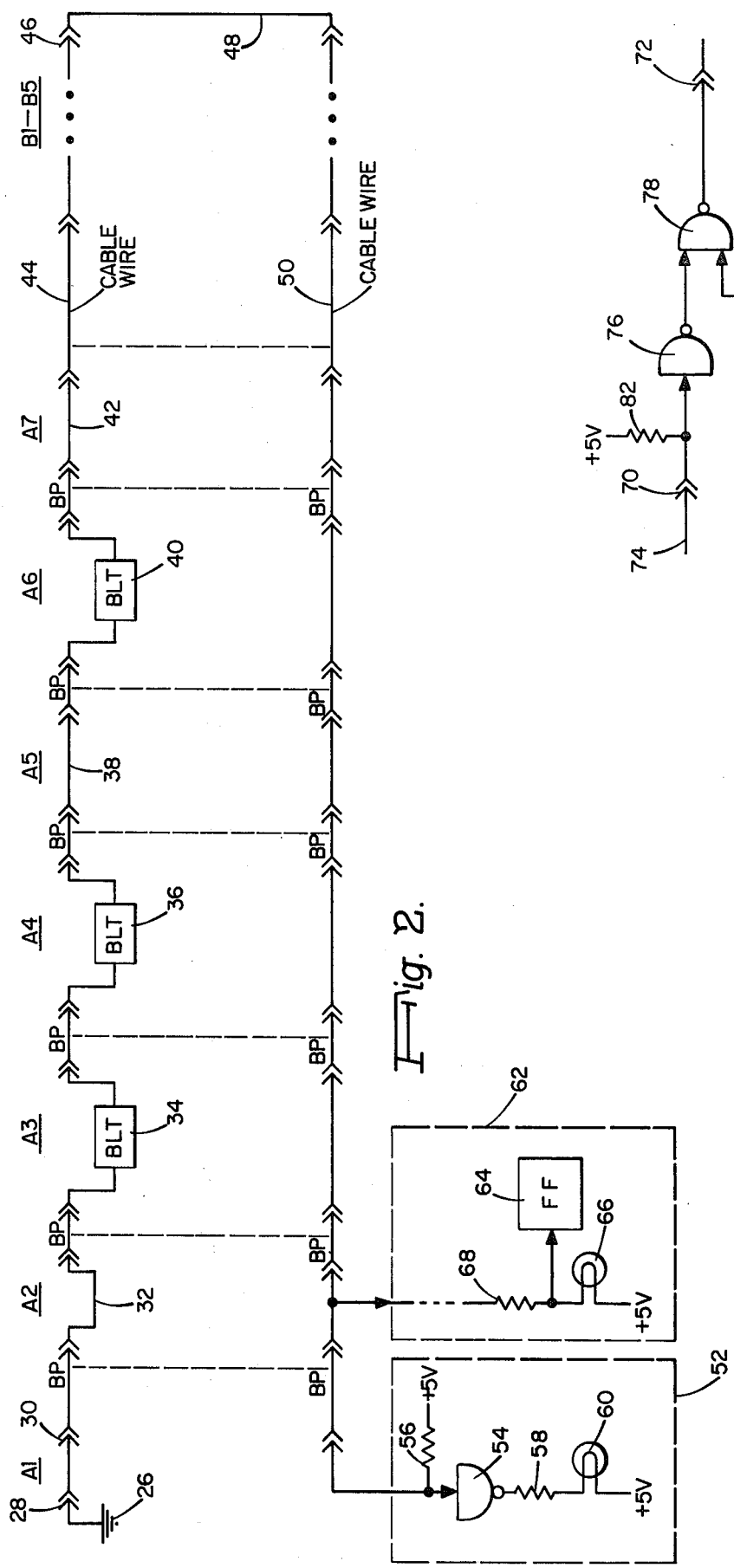
FIG. 2 illustrates the interlock indication apparatus of the present invention.

Now referring to FIG. 2, the manner in which the integrity line is connected in the embodiment generally shown in FIG. 1, shall be more specifically described. The row numbers for module 10, namely rows A1 through A7 are more particularly shown and the rows B1 through B5 of module 12 are generally shown. Ground signal 26 is shown coupled to one terminal 28 of the connector for terminator board 16 in row A1 of module 10. A straight through connection in the terminator board provides the ground signal to the other terminal 30 for the same connector for that which includes terminal 28 and by the backplane (designated BP) to one terminal in the connector 18 for the logic board in row A2. By way of example, the logic board coupled in this position A2 of module 10 does not require verification of the operational status of the logic therein and accordingly a straight through connection 32 is provided to the other terminal of the same connector in that row.

Figure 3:
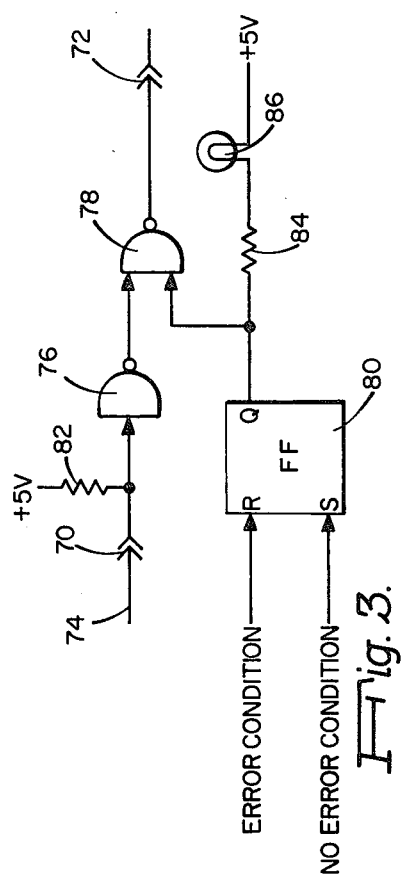
FIG. 3 illustrates further error indication logic of the apparatus of the present invention.

Thus, the ingoing terminal of the logic board in row A3 is coupled to receive the ground signal. In this case, such logic board in row A3 includes what may be termed a basic logic test or quality logic test as indicated by the element 34 interrupting the signal paths for ground 26. A typical basic logic test circuit may indicate whether or not parity is correct or incorrect in the module. Details of this circuit are illustrated in FIG. 3 to be discussed hereinafter. Similarly, the ground signal is passed through the logic board in row A4 which includes the BLT 36 through the direct connection 38 in row A5, through the BLT 40 in row A6 and to the empty slot A7 which in this case has the two terminals for the connector 18 in that position coupled by means of a very short jumper wire 42. Module 12 is coupled to module 10 by means of the cable wire 44 included in cable 23 and so on through positions B1 through B5 in module 12 until the terminal 46 for the terminator board 17 is reached.

Included in terminator board 17 may be a jumper wire between the two connectors so as to insure the integrity of the second plurality of connectors in that particular embodiment. Such connection is shown by wire 48 which may be a printed circuit wire on the terminator board 17. The integrity line or wire is also daisy chained or coupled in a serial manner back through connectors 20 in module 12 through cable wire 50 included in cable 24 and back through module 10 into terminator board 16 at which point indicator logic 52 is provided. It is noted that in this return connection through connectors 20 that no logic board test logic need be provided since it is already provided in the path through connectors 18.

It can be seen that in another embodiment, that the integrity line back through connectors 20 is not absolutely required if the integrity of the connection between logic boards 14 and connectors 20 is assured by the check provided for in the path of connectors 18. That is to say, if the mechanical tolerances and structure of the connectors, backplane and logic boards is such that a proper connection via connectors 18 means that there in all probability must be a sound connection via connectors 20, then the integrity line back through the path of connectors 20 is not needed. However, in yet another embodiment it may be desirable to provide a circuit back through the backplane without the use of connectors 20 if an error indication of an improper connection must be received back at the central processor logic board in the instance where it is connected in row A2. By yet a further embodiment, it may be desirable that each of the logic boards be able to know whether the path through connectors 18 is satisfactory without such logic boards having to inquire as to such status from the central processor. In such case, a circuit wire would be passed back through in the backplane from wire 48 through the path of connectors 20 with only one terminal on each of connectors 20 coupled to such circuit wire so as to enable the logic board to directly ascertain whether the ground signal 26 was successfully transferred to wire 48. This circuit wire would not be an integrity wire but would obviate any need of the logic boards to inquire of the central processor as to the above mentioned system operation and connection conditions. It can also be seen that in a system with only one connector 18 per logic board, that such return path may be provided back through the backplane associated with connectors 18 and that such return path, if desired, may be coupled with one terminal of each of connectors 18 so as to eliminate the need of the logic boards to look to the central processor as to such conditions.

Error indication logic 52 may be included on terminator board 16 or for example may be included on each of the boards, i.e. logic boards 14, in either module 10 or module 12 or both. Assuming the proper connection and operation of the logic boards, a ground, i.e., zero volt signal will be received at inverter 54. With zero volts at the input of inverter 54, the +5 volt connection through load resistor 56 will cause current to flow and accordingly generate a +5 volt signal at the output of inverter 54, which is coupled to one end of series resistor 58, which is included to current limit and prevent noise reflections particularly for long electrical lines coupled thereto. Thus, when the conditions are that all connections are proper and that there is no error on any logic boards, 5 volts is provided via inverter 54 on one side of light 60 which may be for example a light emitting diode. Since there is five volts already coupled on the other side of light 60, light 60 will not light and therefore no error or bad connection will be indicated. It is noted that light 60 will be lit if there is an error condition because of the fact that the input to inverter 54 will be 5 volts causing the output of inverter 54 to provide zero volts so that the light 60 would be lit.

As indicated hereinbefore, circuit 52 may be included on any of the boards. In addition, for example the central processor, which may be one of the logic boards, may have apparatus for storing the fact that there is an error condition. This register may be nothing more than a status flip-flop which may be coupled for example between resistor 58 and light 60. This is shown for example by way of the connection in row A2 which may include the central processor logic board which includes in circuit 62, which is similar to circuit 52, a flip-flop 64 coupled between light 66 and resistor 68. Flip-flop 64 would thus be set to indicate an error condition if there is zero volts on one side of light 66 thereby also lighting the light 66.

Now referring to FIG. 3, there is shown typical circuitry which may be included in for example basic logic test circuits 34, 36 or 40. The circuitry is included between two electrical terminals 70 and 72 for the integrity line for that particular row in the module. If all connections are satisfactory at the input side 74 of the circuitry, then zero volts will be received by inverter 76 and accordingly a high state will be received at the respective input of NAND gate 78. If the other input to NAND gate 78, coupled to the Q output of flip-flop 80, also is a high state indicating that the associated logic circuitry is working satisfactory, then 0 volts will be provided to the next logic board via terminal 72. Normally flip-flop 80, which may receive its inputs from parity test logic for example, is set so that the output is in a high state, that is 5 volts. If an error indication light 86 is also coupled on this board with this BLT circuitry, then via series resistor 84, 5 volts will be received at one side of light 86 but it will not be lit because there will be five volts on both terminals thereof. Flip-flop 80 is set when there is no error condition thereby providing five volts at the Q output thereof and is reset if there is an error condition thereby providing zero volts at the Q output thereof thereby also causing +5 volts to be provided at the output of NAND gate 78 and at terminal 72 to the next board. The end point light, as indicated in FIG. 2 as light 60, will be lit as will the logic board light 86. A +5 volts will also be transferred directly to terminal 72 if received via terminal 70 from the previous board. The use of load or pull-up resistor 82 coupled to +5 volts insures that an error indication received at terminal 70 will be transferred as +5 volts from terminal 72.

Thus the error condition, as may be indicated by an energized light, indicates that there is either a bad connection, a malfunctioning logic board or possibly that there is no logic board in a particular slot or row, i.e., that the boards are not contiguous by row. It can be seen that by placing the light indicating an error condition in strategic locations, that at a glance the operator could tell if there were any such error conditions in the system. For example, by providing one light at the termination, i.e. at the end point as shown in FIG. 2 for light 60, this would indicate that there is an error somewhere in the system. If this light is placed in a position easily seen by the operator then he could take corrective action. Further, if the operator wanted to know exactly where the problem was, then a light for example for the BLT could be provided for each logic board which incudes such a logic test and further for each such pair of terminals. Thus the operator can quickly repair the system by merely replacing a logic board or insuring the connections thereto.

Having described the invention, what is claimed as new and novel and for which it is desired to secure Letters Patent is:

1. Apparatus comprising:
    A. a first plurality of logic boards;
    B. at least one electrical connector included for each of said logic boards, each said connector having a plurality of terminals;
    C. first means for electrically coupling each of said connectors, said means for electrically coupling including means for connecting an electrical circuit through each of said logic boards in a daisy chained arrangement by means of a pair of electrically independent ones of said terminals in each of said connectors so that a continuous electrical circuit is established from a first one of said boards to a last one of said boards, said means for coupling further comprising means, included in at least one of said logic boards, for signalling whether the associated one of said logic boards is capable of operating in a satisfactory manner, said means for signalling comprising means for inhibiting a first signal state from being received at said last one of said logic boards if said associated one of said logic boards is not capable of operating in a satisfactory manner;
    D. means for coupling said first signal state for receipt by one of said terminals of a one of said connectors included on a first one of said logic boards; and
    E. means for indicating that said first signal state has been received at a last one of said connectors, which said last one of said connectors is included in a last one of said logic boards, whereby the proper connection of said boards with said connectors is indicated.

2. Apparatus as in claim 1 wherein said first means for coupling includes:
    A. circuit means, included on said logic boards, for coupling said pair of electrically independent ones of said terminals of an associated said connector; and
    B. means, coupled between each of said connectors, for coupling one of said terminals of one of said connectors to one of said terminals of another one of said connectors.

3. Apparatus as in claim 2 wherein said circuit means in at least one of said logic boards is a direct circuit connection.

4. Apparatus as in claim 2 wherein said circuit means comprises means for receiving a signal indicating whether the parity of the information therein is correct or in error, thereby providing the means by which a one of said logic boards is indicated to be capable of operating in a satisfactory or unsatisfactory manner.

5. Apparatus as in claim 1 wherein said means for indicating includes light generating means responsive to said first signal state for indicating whether there is an improper connection.

6. Apparatus as in claim 1 further comprising further means for indicating, coupled with each of said logic boards, for indicating whether there is a proper connection between the associated one of said boards and the associated said connector;

7. Apparatus as in claim 1 further comprising means for coupling said last one of said logic boards with said first one of said logic boards so that said means for indicating that said first signal state has been received at the one of said connectors included in said last one of said logic boards, is indicated at said first one of said logic boards.

8. Apparatus as in claim 1 further comprising:
    A. at least another electrical connector included on each of said logic boards, said another electrical connector including a plurality of terminals; and B. means for coupling a further electrical circuit from said electrical circuit coupled on said last one of said boards to said first one of said boards.

9. Apparatus as in claim 8 further comprising means for coupling said further electrical circuit to one terminal of said another electrical connector on each of said logic boards whereby each of said logic boards may receive an indication as to whether said first signal state was received at said last one of said logic boards.

10. Apparatus as in claim 8 further comprising means for coupling said further electrical circuit by means of a pair of terminals of each said another electrical connector so that said further electrical circuit is coupled through each of said logic boards in a daisy chained arrangement from said last logic board to said first logic board, whereby said first signal state may be received by said first logic board thereby indicating the proper connection of said boards to said connectors and each said another connector.

11. Apparatus as in claim 1 further comprising:
A. at least another electrical connector included on each of said logic boards, each said another electrical connector including a plurality of terminals;
B. means for coupling a further electrical circuit from said electrical circuit coupled on said last one of said boards to said first one of said boards; and
C. means for coupling said further electrical circuit to one terminal of said another electrical connector on each of said logic boards whereby each of said logic boards may receive an indication as to whether said first signal state was received at said last one of said logic boards.

12. Apparatus as in claim 11 wherein said first means for coupling includes:
A. circuit means, included on said logic boards, for coupling said pair of terminals of the associated said connector; and
B. means, coupled between each said connectors, for coupling one of said terminals of one said connector to one of said terminals of another said connector.

13. Apparatus as in claim 12 wherein said circuit means is a direct circuit connection.

14. Apparatus comprising:
A. a first plurality of logic boards;
B. at least one electrical connector included for each of said logic boards, each said connector having a plurality of terminals;
C. first means for electrically coupling each of said connectors, said means for electrically coupling including means for connecting an electrical circuit through each of said logic boards in a daisy chained arrangement by means of a pair of electrically independent ones of said terminals in each of said connectors so that a continuous electrical circuit is established from a first one of said boards to a last one of said boards;
D. means for coupling a first signal state for receipt by one of said terminals of a one of said connectors included on a first one of said logic boards;
E. means for indicating that said first signal state has been received at a last one of said connectors, which last one of said connectors is included in a last one of said logic boards, whereby the proper connection of said boards with said connectors is indicated; and
F. further means for indicating, coupled with each of said logic boards, for indicating whether there is a proper connection between the associated one of said boards and the associated said connector.

15. Apparatus comprising:
A. a first plurality of logic boards;
B. at least one electrical connector included for each of said logic boards, each said connector having a plurality of terminals;
C. first means for electrically coupling each of said connectors, said means for electrically coupling including means for connecting an electrical circuit through each of said logic boards in a daisy chained arrangement by means of a pair of electrically independent ones of said terminals in each of said connectors so that a continuous electrical circuit is established from a first one of said boards to a last one of said boards;
D. means for coupling a first signal state for receipt by one of said terminals of a one of said connectors included on a first one of said logic boards;
E. means for indicating that said first signal state has been received at a last one of said connectors, which last one of said connectors is included in a last one of said logic boards, whereby the proper connection of said boards with said connectors is indicated;
F. at least another electrical connector included on each of said logic boards, said another electrical connector including a plurality of terminals; and
G. means for coupling a further electrical circuit from said electrical circuit coupled on said last one of said boards to said first one of said boards.

16. Apparatus comprising:
A. a first plurality of logic boards, each of said logic boards including a plurality of electronic components for providing a function such as a data processing unit, peripheral device controller unit and a memory unit, each said unit coupled to communicate data with another said unit over a common electrical bus and each said unit operable even though another said unit is removed from said apparatus;
B. at least one electrical connector included for each of said logic boards, each said connector having a plurality of terminals, each said connector coupled to said common electrical bus;
C. first means for electrically coupling each of said connectors to said common electrical bus, said means for electrically coupling including means for connecting an electrical circuit through each of said logic boards in a daisy chained arrangement by means of a pair of electrically independent ones of said terminals in each of said connectors so that a continuous electrical circuit is established from a first one of said boards to a last one of said boards;
D. means for coupling a first signal state for receipt by one of said terminals of a one of said connectors included on a first one of said logic boards; and
E. means for indicating that said first signal state has been received at a last one of said connectors, which last one of said connectors is included in a last one of said logic boards, whereby the proper connection of said boards with said connectors is indicated.

* * * * *